United States Patent [19]

Williams

[11] 4,147,981
[45] Apr. 3, 1979

[54] ELECTROSTATIC VOLTMETER PROBE POSITIONED ON THE OUTSIDE OF A HOUSING AND VIBRATED BY A PIEZOELECTRIC TRANSDUCER WITHIN THE HOUSING

[76] Inventor: Bruce T. Williams, 15 Pound St., Lockport, N.Y. 14094

[21] Appl. No.: 770,263

[22] Filed: Feb. 18, 1977

[51] Int. Cl.² ............................................. G01R 5/28
[52] U.S. Cl. ................................................. 324/32
[58] Field of Search ................... 324/32, 72, 72.5, 109

[56] References Cited

U.S. PATENT DOCUMENTS

| | | | |
|---|---|---|---|
| 3,317,983 | 5/1967 | De Wit et al. | 324/109 |
| 3,611,127 | 10/1971 | Vosteen | 324/72 |
| 3,729,675 | 4/1973 | Vosteen | 324/72 |
| 3,774,108 | 11/1973 | Ogilvie | 324/72 |
| 3,851,247 | 11/1974 | Vosteen et al. | 324/72 |
| 3,852,667 | 12/1974 | Williams et al. | 324/72 |
| 3,997,839 | 12/1976 | Dreyfus et al. | 324/109 |
| 4,072,896 | 2/1978 | Bijlmer | 324/32 |

Primary Examiner—Robert J. Corcoran
Attorney, Agent, or Firm—Christel & Bean

[57] ABSTRACT

A probe or sensor for an electrostatic voltmeter including a voltage sensitive electrode on the outer surface of a housing wall portion which is vibrated or oscillated by a piezoelectric transducer within the housing and mechanically coupled to the wall portion. The sensitive electrode is moved in a direction generally perpendicular to the plane of the electrode operative surface, the latter being disposed toward an external potential being measured. The capacitive coupling between the electrode operative surface and the external potential is varied at the rate of vibration of the electrode whereby an alternating voltage is induced on the electrode having an amplitude proportional to the amplitude of the external electrical potential being measured. Electrically conducting surfaces in the probe are driven to the same potential as the signal induced on the sensitive electrode.

9 Claims, 5 Drawing Figures

ELECTROSTATIC VOLTMETER PROBE POSITIONED ON THE OUTSIDE OF A HOUSING AND VIBRATED BY A PIEZOELECTRIC TRANSDUCER WITHIN THE HOUSING

BACKGROUND OF THE INVENTION

This invention relates to the electrical measurement art, and more particularly to a new and improved sensor for electrostatic voltmeters.

An instrument which measures electrostatic fields and electrostatic potentials on surfaces without current flow through the instrument is known as an electrostatic voltmeter which makes measurements in a non-contacting manner. These instruments comprise a probe or sensor assembly and an associated voltmeter wherein the probe converts the electrostatic field or surface potential to an a.c. voltage, the magnitude of which is proportioned to the field or potential being measured. This conversion is accomplished by a capacitance modulation process wherein the capacitive coupling between a surface associated with the probe and a surface associated with the field or potential to be measured is modulated or varied at a fixed periodic rate. A voltage difference existing between the two surfaces will induce an a.c. voltage on the probe surface.

In some prior art electrostatic voltmeters unwanted drift and noise can result from dynamic coupling of the detector element to surfaces other than the test surface, especially when such other surfaces are contaminated. In some prior art apparatus, moving the detector element closer to the test surface increases capacitive loading of the test surface by other elements of the sensor. Also, some prior art apparatus is easily damaged by shock or impact and the detector thereof cannot be exposed to extreme temperature or pressure conditions due to the potentially adverse effects of such conditions on other components of the instrument.

SUMMARY OF THE INVENTION

It is, therefore, a primary object of this invention to provide a new and improved sensor for electrostatic voltmeters.

It is a further object of this invention to provide a sensor for electrostatic voltmeters which avoids the problem of extraneous capacitive coupling of the sensor detector element.

It is a further object of this invention to provide a sensor for electrostatic voltmeters which enables the sensor detector element to be positioned relatively close to a test surface while at the same time reducing the total capacitive loading of the test surface by the sensor.

It is a further object of this invention to provide a sensor for electrostatic voltmeters which enable the detector element thereof to be exposed to extreme conditions in a manner not damaging the other elements thereof.

It is a further object of this invention to provide such a sensor which is relatively rugged yet simple in construction and economical to manufacture and maintain.

The present invention provides a probe or sensor for an electrostatic voltmeter comprising a voltage sensitive electrode on the outer surface of a housing wall portion which is vibrated or oscillated by means within the housing and mechanically coupled to the wall portion. The sensitive electrode is moved in a direction generally perpendicular to the plane of the electrode operative surface. The capacitive coupling between the electrode operative surface and an external potential being measured is varied at the rate of vibration of the electrode whereby an alternating voltage is induced on the electrode having an amplitude proportional to the amplitude of the external electrical potential being measured. Electrically conducting surfaces in the probe are driven to the same potential as the signal induced on the sensitive electrode.

The foregoing and additional advantages and characterizing features of the present invention will become apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

Basic non-contacting electrostatic voltmeter systems include a probe or sensor electrically connected by a cable or the like to a meter assembly including appropriate circuits. The probe or sensor heretofore has included a housing having an aperture in a wall thereof and a voltage sensitive electrode within the housing and adapted to be exposed through the aperture to an external electrical field or potential being measured. The voltage-sensitive electrode is vibrated or oscillated relative to the aperture to vary the capacitive coupling between the electrode and the external field or potential as a function of the rate of vibration of the electrode. An alternating voltage is induced on the electrode having an amplitude proportional to the amplitude of the electrical field or potential being measured.

In the sensor according to the present invention the housing includes a continuous solid wall portion which is relatively stiff and capable of transmitting vibratory motion, a voltage sensitive electrode fixed to the outer surface of the housing wall portion and having an exposed operative surface, and vibrator means in the housing and mechanically coupled to the inner surface of the housing wall portion to vibrate the electrode in a direction generally perpendicular to the exposed operative surface thereof. The capacitive coupling between the electrode operative surface and an external field or potential being measured is varied as a function of the rate of vibration of the electrode whereby an alternating voltage is induced on the electrode having an amplitude proportional to the amplitude of the external electrical field or potential being measured. The sensor according to the present invention avoids extraneous capacitive coupling of the voltage sensitive electrode, enables the electrode to be positioned relatively close to a test surface while simultaneously reducing the total capacitive loading of the test surface by the sensor, and allows the electrode to be exposed to extreme conditions such as temperature and pressure in a manner not damaging the other sensor components.

Figure 1:
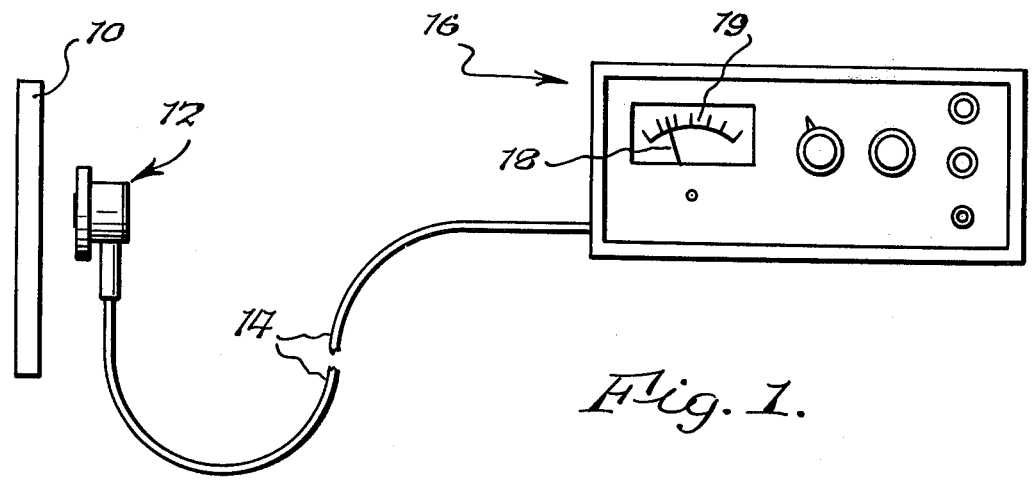
FIG. 1 is an elevational view with parts removed of an electrostatic voltmeter provided with a sensor according to the present invention.
Figures 2, 3:
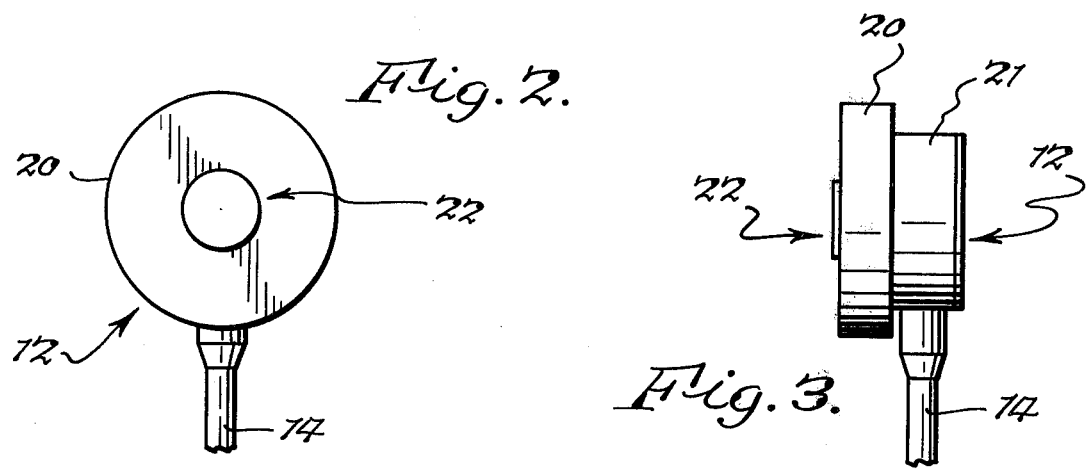
FIG. 2 is a fragmentary elevational view of a sensor according to the present invention.
FIG. 3 is a fragmentary elevational view similar to FIG. 2 and rotated through ninety degrees.

FIG. 1 illustrates an electrostatic voltmeter for measuring the electrostatic field or electrostatic potential associated with a surface 10. The electrostatic voltmeter comprises a probe or sensor 12 which during measurement is placed in proximity to but not in contact with the test surface 10 undergoing the measuring process. Probe 12 is connected by an electrical cable 14 to appropriate circuits within a meter assembly 16 including an indicator dial 18 and scale 19 from which the value or magnitude of the measured electrostatic field or potential is read.

Probe 12 of the present invention comprises a generally cylindrical housing having two outer surface portions 20, 21 of different diameters. The larger diameter portion 20 terminates in an axial end face on which is located a voltage sensitive electrode generally designated 22.

Figure 4:
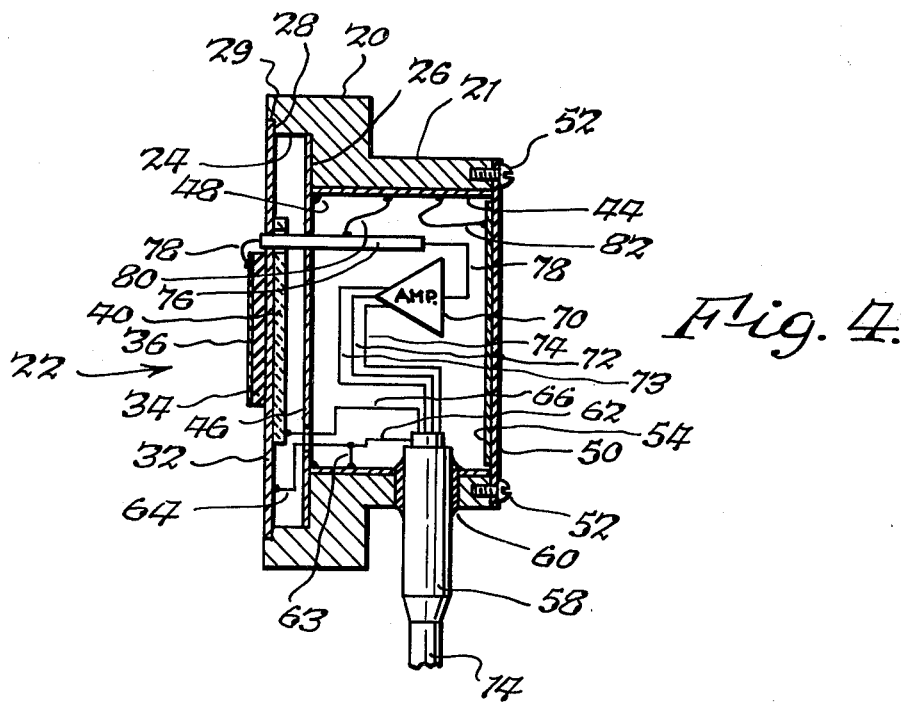
FIG. 4 is a longitudinal sectional view, with parts shown diagrammatically and in elevation, of a sensor according to the present invention.

Referring now to FIG. 4, the probe housing is of electrical insulating material, for example plastic, and the portion 21 has a constant inner diameter which extends axially into the portion 20 where it meets a larger inner diameter portion 24 at an annular ledge 26 disposed generally perpendicular to the longitudinal axis of the housing. Portion 24 terminates in a small annular recess defined by surfaces 28,29 adjacent an outer axial end surface of the housing portion 20. The housing includes a continuous solid wall portion in the form of a relatively thin element 32 which closes the outer axial end of the housing portion 20, and the wall portion or element 32 is relatively stiff and capable of transmitting vibratory motion. In particular, element 32 is a thin metal disc, for example of brass, which seats around the marginal or peripheral edge portion in the annular ledge or recess defined by surfaces 28, 29. When seated in place, element 32 is disposed generally perpendicular to the longitudinal axis of the housing, and the outer surface of element 32 is substantially flush with the axial end face of housing portion 20.

The voltage sensitive electrode 22 is fixed to the outer surface of housing wall portion 32 and has an exposed outer surface. In particular, electrode 22 comprises a body 34 of electrically insulating material fixed to wall portion 32 and a layer 36 of electrically conducting material on the exposed outer surface of the body 34. Body 34 can comprise a disc of printed circuit board material cemented to the outer surface of wall portion 32, and layer 36 can be of copper coated or cladded on the outer surface of disc 34. In the sensor shown, the surface area of electrode 22 is less than the area of wall portion 32, in particular less than one-half.

The sensor of the present invention further comprises vibrator means in the housing and mechanically coupled to the inner surface of housing wall portion 32 to vibrate electrode 22 in a direction generally perpendicular to the exposed operative surfaces 36 of the electrode. In the sensor shown, the vibrator means comprises a transducer element connected to the inner surface of wall 32 for converting electrical signals into vibratory motion. The transducer comprises a plate or disc-shaped quartz piezoelectric crystal element 40. Element 40 is secured such as by cement with one planar surface firmly contacting the inner surface of wall portion 32. The piezoelectric element 40 is located in registry with, i.e., directly behind, electrode 22, and in the sensor shown the piezoelectric element 40 is larger in surface area than electrode 22.

A chamber is defined within the housing by means of a hollow element 44, preferably cylindrical, of electrically conducting material, preferably metal such as brass. The cylindrical element 44 has an axial length substantially equal to the axial distance between the outer axial end face of housing portion 21 and the annular ledge 26. The outer diameter of element 44 is substantially equal to the inner diameter of housing portion 21. A plate-like element 46, preferably disc-shaped, of electrically conducting material, preferably metal such as brass, is fixedly sealed to the end of hollow element 44 which is located within housing portion 20. Element 46 has an outer diameter substantially equal to the diameter of housing inner surface 24 whereby element 46 fits snugly within housing portion 20 in firm contact with annular ledge 26. The marginal or peripheral surface of disc 46 can be cemented to surface 26. The axial end face of cylinder 44 contacts the surface of disc 46, and the two elements are soldered or welded at the annular junction 48. A closure element 50 of electrically insulating material, for example printed circuit board material, is fastened such as by screws 52 to the outer axial end face of housing portion 21. Closure element 50 is relatively thin and plate-like, preferably disc-shaped having an outer diameter substantially equal to the outer diameter of housing portion 21. Closure element 50 is provided with a layer 54 of electrically conducting material on the inner surface thereof, for example a coating or cladding of copper. Layer 54 covers substantially the entire area of closure element 50 which faces the interior of cylindrical element 44. Thus, a chamber within the housing is defined by sleeve 44, disc 46 and closure element 50 coated with layer 54 exposed to the chamber interior.

The end of cable 14 which connects sensor 12 electrically to meter assembly 16 is in communication with the chamber interior. In particular, the end of cable 14 is fitted with a strain relief bushing 58, and an aperture is provided through housing wall portion 21 and sleeve 44. The cable end and bushing 58 are secured by cement 60 into the assembly. Cable 14 contains a number of conductors or leads which are connected electrically to various components of sensor 12. In particular, a cable lead 62 is connected by leads 63 and 64 to sleeve 44 and wall portion 32, respectively, for applying a reference potential to sleeve 44 and wall 32 in a manner which will be described in detail presently. A cable lead 66 is connected to the transducer or piezoelectric element 40 for applying an energizing electrical signal to element 40 in a manner which will be described in detail presently. An amplifier 70 is shown diagrammatically in FIG. 4 within the housing chamber, and is supported therein by suitable means. For example, the interior of the chamber can contain an appropriate potting compound which would support amplifier 70 and its associated components. A cable lead 72 is connected to the amplifier output, and two additional cable leads 73,74 are connected to amplifier 70, all for purposes which will be described in detail presently. The exposed sensitive surface of electrode 22 is connected electrically to the input of amplifier 70 by means including a section or length of a rigid coaxial conductor 76 positioned within the housing chamber and having one end which extends out through aligned apertures provided in disc 46, piezoelectric element 40 and wall 32 as shown in FIG. 4. The inner conductor 78 of coaxial conductor 76 is connected at one end to the electrode surface 36, and is connected at the other end to the input of amplifier 70.

The coaxial conductor 76 is provided with a shield in the form of an external coating of conductive paint or conductive epoxy material, for example copper epoxy, and this shield is connected by a lead 80 to the conductive sleeve 44. Sleeve 44 and conductive layer 54 are connected electrically by a lead 82.

By way of example, in a typical sensor 12 the housing has an overall length of about 0.8 inch, portion 20 has a length of 0.35 inch and an outer diameter of 1.5 inch and portion 21 has an outer diameter of 1.125 inch. Wall element 32 has a diameter of 1⅜ inch and a thickness of 0.01 inch. Electrode element 36 has a diameter of 0.5 inch and an overall thickness of 1/32 inch. Sleeve 44 has a wall thickness of 0.005 inch, and disc 46 has a thickness of 0.01 inch. Cover element 50 has a thickness of 1/16 inch. The length of cable 14 generally is 5–6 feet.

Figure 5:
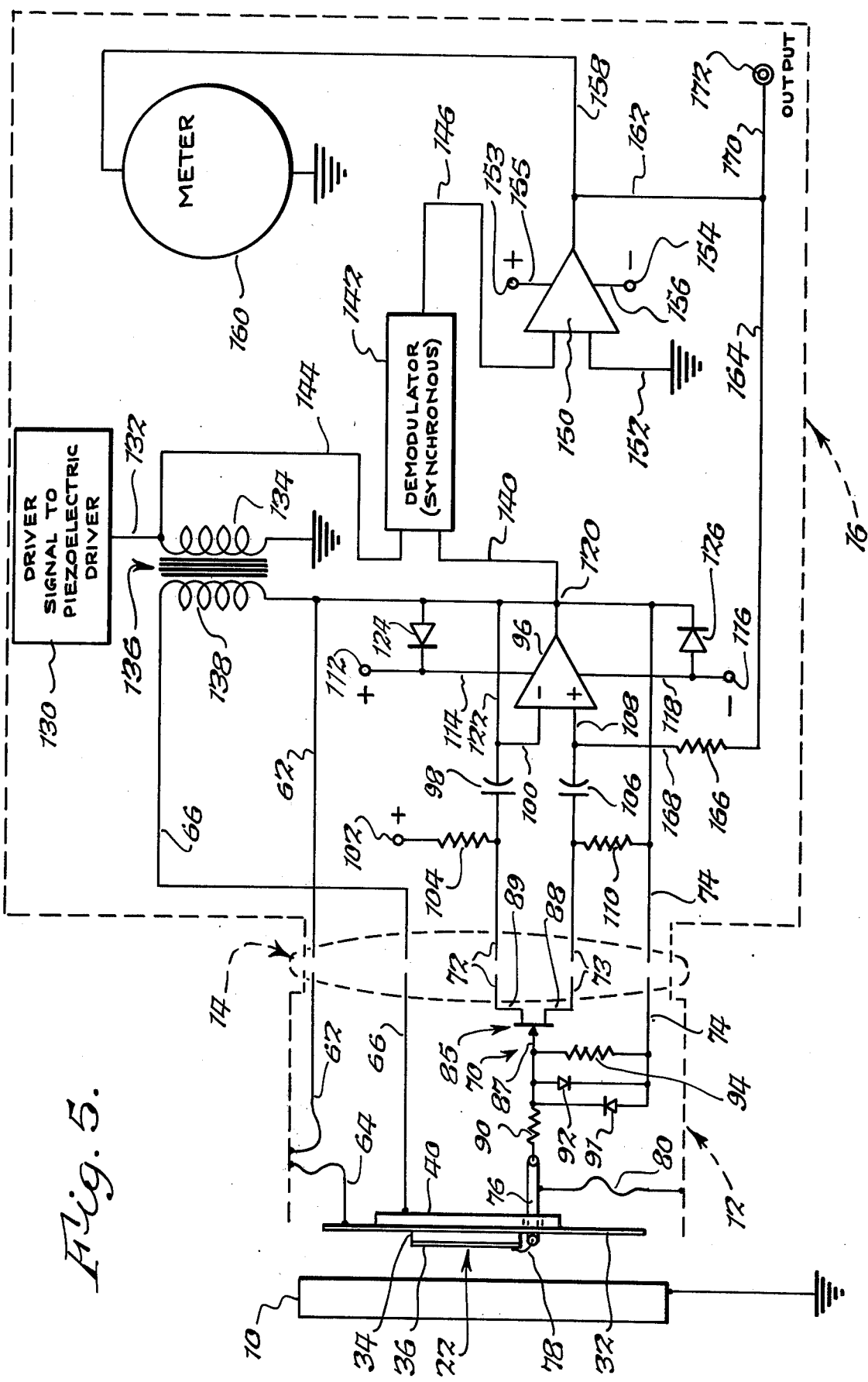
FIG. 5 is a schematic circuit diagram showing the electrical connection of the sensor of the present invention in an electrostatic voltmeter system.

FIG. 5 is a schematic circuit block diagram of the electrostatic voltmeter system of FIG. 1. Amplifier 70 in probe 12 functions as a high impedance preamplifier and includes a field effect transistor 85 having gate, source and drain terminals 87, 88 and 89, respectively. Conductor 78 of coaxial element 76 is connected through a resistor 90 to gate terminal 87, and a pair of protective diodes 91 and 92 are connected in parallel, opposite poled relation between gate terminal 87 and cable lead 74. A d.c. return resistor 94 also is connected between gate terminal 87 and lead 74 in parallel with diodes 91,92.

The output of preamplifier 70 in probe 12 is connected to the input of an amplifier 96 connected as a follower type amplifier. In particular, line 72 is connected to one terminal of a capacitor 98, the other terminal of which is connected by a line 100 to the negative input terminal of amplifier 96. A source of positive bias voltage (not shown) in the assembly 16 is connected to a terminal 102 which, in turn, is connected through a voltage dropping resistor 104 to line 72. Similarly, line 73 is connected to one terminal of a capacitor 106, the other terminal of which is connected by a line 108 to the positive input terminal of amplifier 96. A resistor 110 is connected across lines 73 and 74.

A source of positive bias voltage (not shown) in the assembly 16 is connected to a terminal 112 which, in turn, is connected by a line 114 to amplifier 96. Similarly, a source of negative bias voltage (not shown) in the assembly 16 is connected to a terminal 116 which, in turn, is connected by a line 118 to amplifier 96. The output terminal 120 of amplifier 96 is connected by a line 122 to line 100 which is connected to the amplifier negative input terminal. Lines 62 and 74 also are connected to amplifier output terminal 120. The amplifier output terminal 120 also is connected by protective diodes 124 and 126 to lines 114 and 118, respectively.

The voltmeter system further comprises an oscillator generally designated 130 for providing a driver signal to the transducer or piezoelectric driver element 40. Electrical power for operating oscillator 130 can be obtained from conventional a.c. line voltage connected through a suitable transformer (not shown) to the oscillator input, and by way of example oscillator 130, which can be of various commercially available types, provides an output signal having a frequency four times line frequency. The output of oscillator 130 is connected by a line 132 to one terminal of the primary winding 134 of an isolating and matching transformer 136. The other terminal of winding 134 is connected to a circuit ground or reference terminal. One terminal of the transformer secondary winding 138 is connected to line 66 which, in turn, is connected to piezoelectric element 40. The other terminal of secondary winding 138 is connected to the junction of line 62 and the amplifier output terminal 120.

The output terminal 120 of amplifier 96 also is connected by a line 140 to the input of a synchronous demodulator generally designated 142. A line 144 connects the output of oscillator 130 to demodulator 142 whereby the oscillator output signal serves as a reference phase for the demodulator. The output of demodulator 142 is connected by a line 146 to one input of a high gain integrating amplifier 150. The other input of amplifier 150 is connected by a line 152 to a circuit ground or reference terminal. Positive and negative bias voltages from sources (not shown) in the assembly 16 are applied to terminals 153 and 154, respectively, which in turn are connected by lines 155 and 156, respectively, to amplifier 150. The output of amplifier 150 is connected by a line 158 to one terminal of a voltmeter 160, the other terminal of which is connected to the circuit ground or reference terminal. The output of amplifier 150 also is connected by a line 162 to another line 164 which, in turn, is connected to one terminal of a resistor 166, the other terminal of which is connected by a line 168 to line 108 leading to the positive input of amplifier 96. Resistor 166 serves as the d.c. return for amplifier 96. The junction of lines 162 and 164 is connected by a line 170 to a circuit output terminal 172.

The system of FIG. 5 operates in the following manner. Probe 12 is moved into position with electrode 22 facing a surface such as the best surface 10 bearing the electrostatic field to be measured. With the electrode sensitive surface 36 exposed to the test surface 10 there is capacitive coupling between electrode 22 and surface 10. Oscillator 130 applies an a.c. voltage through conductor 66 to piezoelectric element 40 causing element 40 to vibrate in a direction generally perpendicular to the plane of wall portion 32, and at a frequency substantially equal to the oscillator output frequency. The relatively stiff metal wall element 32 transmits the vibrations of piezoelectric element 40 to electrode 22. Electrode 22 is vibrated in a direction generally perpendicular to the plane thereof and at a frequency substantially equal to the output frequency of oscillator 130. As electrode 22 is vibrated it moves toward and away from the test surface 10 thereby varying the capacitive coupling between the electrode sensitive surface 36 and the test surface 10. The detector electrode 22 is d.c. referenced to the feedback potential on line 164 by means of the connection of the d.c. return resistor 166 to line 164. The d.c. return resistor 94 of the preamplifier 70 is d.c. referenced to the output of amplifier 96. In effect, the d.c. return for the detector electrode 22 is the feedback potential on line 164.

If the potential of the detector electrode, which is the system feedback potential, is different from the potential on test surface 10, an a.c. signal is induced on the surface 36 of electrode 22. This induced a.c. signal is applied to the input of preamplifier 70. The amplitude and phase of the induced signal, relative to the drive signal obtained from oscillator 130, is dependent on the magnitude and polarity of the difference potential respectively of the two surfaces. The output of preamplifier 70 is amplified by amplifier 96 and applied to the input of demodulator 142. The synchronous demodulator 142, using the drive signal obtained from oscillator 130 as a reference phase, functions to remove the amplitude and phase information from the induced a.c. signal. The use of the line frequency derived oscillator signal insures that the modulation of any ambient induced signals onto the detector electrode 22 cannot appear as noise after the demodulation process. The demodulated signal on line 146, which is a d.c. voltage, is then amplifier in the high gain integrating amplifier 150. The output of amplifier 150 is applied through lines 162, 164 as a feedback reference potential back to the electrode surface 36 in probe 12. In this way, the output of amplifier 150 is servo driven to the same potential as the test surface 10. The meter 160 and output terminal 172 provide continual display and monitoring, respectively, of the feedback reference potential to indicate the test surface potential with high accuracy and essentially zero drift. In summary, if a difference in potential exists between the detector electrode 22 reference, i.e., feedback potential, and test surface 10, an a.c. signal will be induced on the surface of detector 22. This a.c. signal then is amplified, detected and used to change the feedback voltage to make it equal to the test surface potential.

In the probe 12 of the present invention all probe shielding is returned to the same a.c. potential as that of the detector 22. This minimizes capacitive loading of detector 22 by the shield surfaces at the frequency of oscillator 130. In particular, all the probe conductive or metal surfaces including wall element 32, element 46, sleeve 44, surface 54 of closure 50, and the shield of coaxial conductor 76 are driven to the same potential as the signals on electrode surface 36. Element 46, sleeve 44 and closure 50 form an electrically shielded compartment or chamber for preamplifier 70 and its associated components.

In the probe 12 of the present invention, the external mounting of electrode 22 relative to the probe housing avoids any problem of extraneous dynamic coupling to surfaces other than test surface 10. This, in turn, prevents drift and noise otherwise caused by coupling to such other surfaces when these surfaces are contaminated. In addition, the external mounting allows the detector electrode 22 to be positioned closer to test surface 10 without requiring the other electrical components of probe 12 also to be closer to surface 10. This increases the gain of the system while reducing the total capacitive loading of test surface 10 by the system. Furthermore, because the detector electrode 22 is externally mounted on the probe housing the electrode can be exposed to an environment which is different from the environment of the rest of the housing. As a result, the detector electrode 22 can be exposed to high and low temperature and pressure conditions while keeping the electronic components of probe 12 such as preamplifier 70 at relatively normal conditions.

In the probe 12 of the present invention, the forces for vibrating the detector electrode 22 relative to test surface 10 are transmitted from piezoelectric element 40 through the housing wall portion 32. Wall portion 32 is a relatively stiff member, for example hard brass having a thickness of 0.010 inch. As a result, the probe 12 is extremely rugged and can withstand shock and impact forces. Furthermore, as a result of the use of the stiff driving member 32 there is no relative motion between detector electrode 22 and element 32 at the point where the two components are joined together. This in turn substantially eliminates dynamic coupling between the components. For example, if electrode 22 and wall portion 32 were to become contaminated with toner or other charged particles, the detector electrode 22 will not produce a signal proportional to this contamination because electrode 22 does not move relative to the contaminant particles and consequently cannot produce modulated signals because of the presence of such contaminants. This is of primary importance when probe 12 and the associated system is used in applications where the detector to test surface spacing is large. In such applications a large spacing would reduce the dynamic coupling to the test surface which could make the extraneous coupling to the housing surfaces dominate. This would result in large zero shifts in the voltmeter output when these surfaces are contaminated. In the probe 12 of the present invention, little zero shift is noted as a function of probe to test surface spacing even with gross contamination of the housing surfaces.

Probe 12 of the present invention and the associated voltmeter system is a high performance, low cost instrument which finds many uses in research, production and quality control applications. The extremely small size, ruggedness and ease of operation of probe 12 make it ideal for use as a portable instrument for field set up and adjustment of electrostatic copying machines. In such applications, the small probe 12 can be installed quickly in the copying machine and used to establish proper potential levels on the photoconductive surfaces. Examples of other uses include electrophotographic materials evaluation, research on electrets, ceramics and fabrics, and electrostatic charge accumulation monitoring. The probe 12 of the present invention is extremely stable and is unaffected by temperature, humidity, shock and startup drifts.

It is therefore apparent that the present invention accomplishes its intended objects. While a single embodiment of the present invention has been described in detail this is for purposes of illustration, not limitation.

I claim:
1. A sensor for an electrostatic voltmeter comprising:
 (a) a housing including a continuous solid wall portion having substantially parallel inner and outer surfaces, said wall portion being relatively stiff and capable of transmitting vibratory motion;
 (b) a voltage sensitive electrode fixed to the outer surface of said housing wall portion and having an exposed operative surface for capacitive coupling to an external field or potential to be measured; and
 (c) vibrator means in said housing and mechanically coupled to the inner surface of said housing wall portion for vibrating said electrode in a direction generally perpendicular to said exposed operative surface to vary the capacitive coupling between said electrode operative surface and the external field or potential being measured as a function of the rate of vibration of said electrode to induce an alternating voltage on said electrode having an amplitude proportional to the amplitude of the external field or potential being measured;
 (d) whereby the location of said voltage sensitive electrode avoids extraneous dynamic coupling to surfaces other than the surface bearing the field or potential being measured.
2. Apparatus according to claim 1, wherein said housing is generally cylindrical in shape and said wall portion is on one end of said housing and disposed generally perpendicular to the longitudinal axis of said housing.
3. Apparatus according to claim 1, wherein said wall portion is of metal.
4. Apparatus according to claim 1, wherein said wall portion is of electrically conducting material and said electrode comprises a body of electrically insulating material fixed to said housing wall portion and a layer of electrically conducting material on the exposed surface of said body.

5. Apparatus according to claim 1, wherein said vibrator means comprises a transducer element connected to the inner surface of said housing wall portion for converting electrical signals into vibratory motion and means for connecting said transducer element to an electrical signal source.

6. Apparatus according to claim 5, wherein said transducer element comprises a piezoelectric element.

7. Apparatus according to claim 1, wherein said housing wall portion is of a material capable of holding an electrical potential, and further including means to apply a reference potential substantially equal to the electrical potential being measured to said housing wall portion.

8. Apparatus according to claim 1, further including insulated electrical conductor means for connecting said electrode to circuit means for providing an indication of the magnitude of the electrical potential being measured, a shield surrounding said conductor and being of a material capable of holding an electrical potential, and means to apply a signal substantially identical to the signal induced on said electrode to said shield.

9. Apparatus according to claim 1, further including means defining a chamber within said housing, said chamber defining means being of a material capable of holding an electrical potential, and means to apply a signal to said chamber defining means substantially identical to the signal induced on said electrode.

* * * * *